(12) United States Patent
Nakamura et al.

(10) Patent No.: US 8,846,474 B2
(45) Date of Patent: Sep. 30, 2014

(54) DUAL WORKFUNCTION SEMICONDUCTOR DEVICES AND METHODS FOR FORMING THEREOF

(71) Applicant: Tokyo Electron Limited, Tokyo (JP)

(72) Inventors: Genji Nakamura, Delmar, NY (US); Toshio Hasegawa, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/632,101

(22) Filed: Sep. 30, 2012

(65) Prior Publication Data

US 2014/0048885 A1     Feb. 20, 2014

Related U.S. Application Data

(60) Provisional application No. 61/691,212, filed on Aug. 20, 2012.

(51) Int. Cl.
*H01L 21/283* (2006.01)

(52) U.S. Cl.
USPC ........... 438/275; 438/276; 438/277; 438/278; 438/279

(58) Field of Classification Search
USPC .......................... 438/275, 276, 277, 278, 279
See application file for complete search history.

(56) References Cited

U.S. PATENT DOCUMENTS

| 7,332,433 | B2 | 2/2008 | Choi et al. | |
|---|---|---|---|---|
| 7,651,935 | B2 * | 1/2010 | Adetutu et al. | 438/585 |
| 8,105,931 | B2 | 1/2012 | Hsu et al. | |
| 2003/0180994 | A1 | 9/2003 | Polishchuk et al. | |
| 2009/0020821 | A1 | 1/2009 | Jakschik et al. | |
| 2010/0006955 | A1 | 1/2010 | Takimoto | |
| 2010/0252888 | A1 * | 10/2010 | Iwamoto | 257/369 |
| 2010/0330812 | A1 | 12/2010 | Akiyama et al. | |
| 2011/0081774 | A1 | 4/2011 | Yeh et al. | |
| 2011/0195549 | A1 | 8/2011 | Chuang et al. | |
| 2012/0056269 | A1 | 3/2012 | Chung et al. | |

OTHER PUBLICATIONS

United States Patent and Trademark Office, International Search Report and Written Opinion for corresponding international application No. PCT/US13/54969, mailed Jan. 16, 2014, 7 pages.

* cited by examiner

*Primary Examiner* — Matthew W Such
*Assistant Examiner* — Stephen C Smith

(57) ABSTRACT

Embodiments of the invention provide dual workfunction semiconductor devices and methods for manufacturing thereof. According to one embodiment, the method includes providing a substrate containing first and second device regions, depositing a dielectric film on the substrate, and forming a first metal-containing gate electrode film on the dielectric film, wherein a thickness of the first metal-containing gate electrode film is less over the first device region than over the second device region. The method further includes depositing a second metal-containing gate electrode film on the first metal-containing gate electrode film, patterning the second metal-containing gate electrode film, the first metal-containing gate electrode film, and the dielectric film to form a first gate stack above the first device region and a second gate stack above the second device region.

8 Claims, 5 Drawing Sheets

DUAL WORKFUNCTION SEMICONDUCTOR DEVICES AND METHODS FOR FORMING THEREOF

CROSS-REFERENCE TO RELATED APPLICATIONS

Pursuant to 37 C.F.R. §1.78(a)(4), this application claims the benefit of and priority to prior filed Provisional Application Ser. No. 61/691,212, filed Aug. 20, 2012, which is expressly incorporated herein by reference.

FIELD OF THE INVENTION

The present invention relates to semiconductor processing, and more particularly to a method for manufacturing complementary metal oxide semiconductor (CMOS) devices with adjustable workfunctions.

BACKGROUND OF THE INVENTION

In the semiconductor industry, the minimum feature sizes of microelectronic devices are approaching the deep submicron regime to meet the demand for faster, lower power microprocessors and digital circuits. The Si-based microelectronic technology is currently faced with major materials challenges to achieve further miniaturization of integrated circuit devices. A gate stack containing a $SiO_2$ gate dielectric and a degenerately doped polycrystalline Si gate electrode, which has served the industry for several decades, will be replaced with a gate stack having a higher capacitance.

High-capacitance materials, known as high-k materials (where "k" refers to the dielectric constant of the material), feature a dielectric constant greater than that of $SiO_2$ (k~3.9). In addition, high-k materials may refer to dielectric materials that are deposited onto substrates (e.g., $HfO_2$, $ZrO_2$) rather than grown on the surface of the substrates (e.g., $SiO_2$, $SiO_xN_y$). High-k materials may, for example, incorporate metallic silicates or oxides (e.g., $Ta_2O_5$ (k~26), $TiO_2$ (k~80), $ZrO_2$ (k~25), $Al_2O_3$ (k~9), HfSiO (k~5-25), and $HfO_2$ (k~25)).

In addition to the gate dielectric layer, the gate electrode layer also represents a major challenge for future scaling of microelectronic devices. The introduction of metal-containing gate electrodes to replace the traditional doped poly-Si gate electrode can bring about several advantages. These advantages include elimination of the poly-Si gate depletion effect, reduction in sheet resistance, better reliability and potentially better thermal stability on the advanced high-k dielectric materials. In one example, switching from poly-Si to a metal-containing gate electrode can achieve a 2-3 Angstrom (Å) improvement in the effective or electrical thickness of the gate stack. This improvement occurs largely because the problem of poly-Si depletion at the interfaces with other materials is removed entirely.

Work function, resistivity, and compatibility with complementary metal oxide semiconductor (CMOS) technology are key parameters for the new gate electrode materials. One of the material selection criteria for the metal-containing gate electrode is that the work function be tunable. The work function of a material is the minimum energy needed to remove an electron from a solid to a point immediately outside the solid surface. Positive-channel Metal Oxide Semiconductor (PMOS) and the Negative-channel Metal Oxide Semiconductor (NMOS) transistor gate electrodes require different gate materials be used for the gate electrode to achieve acceptable threshold voltages; the latter having a Fermi level near the silicon valence band (E~4 eV), and the former having a Fermi level near the conduction band (E~5.1 eV).

High-energy implantation of dopant ions (e.g., nitrogen ions) into a metal gate electrode layer in a gate stack has been previously researched in order to lower the work function. However, ion implantation methods that include exposing the metal layer to high-energy ions can damage the gate stack, for example cause charging damage of the dielectric layer that can increase the leakage current and decrease the reliability of the dielectric layer. The charging damage from exposure of high-energy ions is expected to increase as the minimum feature sizes get smaller and the different materials layers that form gate stacks get thinner. Therefore, new methods are needed for processing gate stacks and, in particular, new methods for tuning the work function of the gate stacks are needed.

SUMMARY OF THE INVENTION

Embodiments of the invention provide dual workfunction semiconductor devices and methods for manufacturing thereof. The methods can include materials and process flows that are commonly found in semiconductor manufacturing.

According to one embodiment of the invention, the method includes providing a substrate containing first and second device regions, depositing a dielectric film on the substrate, and forming a first metal-containing gate electrode film on the dielectric film, wherein a thickness of the first metal-containing gate electrode film is less over the first device region than over the second device region. The method further includes depositing a second metal-containing gate electrode film on the first metal-containing gate electrode film, and patterning the second metal-containing gate electrode film, the first metal-containing gate electrode film, and the dielectric film to form a first gate stack above the first device region and a second gate stack above the second device region.

According to one embodiment, forming the first metal-containing gate electrode film includes depositing the first metal-containing gate electrode film on the dielectric film, and etching the first metal-containing gate electrode film to reduce the thickness of the first metal-containing gate electrode film above the first device region relative to the thickness of the first metal-containing gate electrode film above the second device region.

According to another embodiment, forming the first metal-containing gate electrode film includes depositing the first metal-containing gate electrode film on the dielectric film, forming a first patterned film on the first metal-containing gate electrode film above the first device region, depositing additional first metal-containing gate electrode film on the first patterned film and on the first metal-containing gate electrode film, forming a second patterned film on the additional first metal-containing gate electrode film above the second device region, and removing the additional first metal-containing gate electrode film above the first device region to expose the first patterned film, and the patterning further comprises patterning the additional first metal containing gate electrode film above the second device region.

According to one embodiment, a dual workfunction semiconductor device is provided, where the device includes a substrate containing a first device region and a second device region, a first gate stack above the first device region, and a second gate stack above the second device region, where the first and second gate stacks contain a gate dielectric film on the substrate, a first metal-containing gate electrode on the gate dielectric film, and a second metal-containing gate electrode on the first metal-containing gate electrode, and where a thickness of the first metal-containing gate electrode is less over the first device region than over the second device region.

According to another embodiment, a dual workfunction semiconductor device is provided, where the device includes a substrate containing a first device region and a second device region, a first gate stack above the first device region, and a second gate stack above a second device region, where the first and second gate stacks contain a high-k film on the substrate, a TiN gate electrode on the high-k film, and a Ti metal gate electrode on the TiN gate electrode, and wherein a thickness of the TiN gate electrode is less over the first device region than over the second device region, and where the second gate stack has a lower workfunction than the first gate stack.

DETAILED DESCRIPTION OF SEVERAL EMBODIMENTS OF THE INVENTION

Embodiments of the invention provide a method for manufacturing a semiconductor device containing metal-containing gate electrode films with a tunable work function.

Figure 1A:
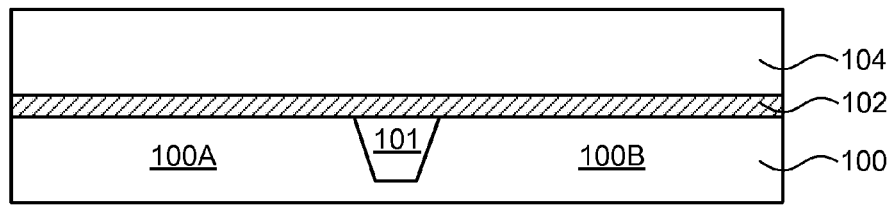
FIGS. 1A-1G schematically show cross-sectional views of a method of forming a dual workfunction semiconductor device according to an embodiment of the invention.

FIGS. 1A-1G schematically show cross-sectional views of a method of forming a dual workfunction semiconductor device according to an embodiment of the invention. FIG. 1A schematically shows a cross-sectional view of a film stack on a substrate 100 having a first device region 100A and a second device region 100B that are separated by a shallow trench isolation (STI) 101. Depending on the type of device being fabricated, the substrate 100 and the device regions 100a/100b may contain bulk silicon substrate, single crystal silicon (doped or undoped), semiconductor on insulator (SOI) substrate, or any other semiconductor material including, for example, Si, SiC, SiGe, SiGeC, Ge, GaAs, InAs, InP, as well as other III/V or II/VI compound semiconductors or any combinations thereof. The substrate 100 can be of any size, for example a 200 mm substrate, a 300 mm substrate, a 450 mm substrate, or an even larger substrate. In one example, the substrate 100 can include a tensile-strained Si layer. According to another embodiment, the substrate 100 may contain Ge or $Si_xGe_{1-x}$ compounds, where x is the atomic fraction of Si, 1−x is the atomic fraction of Ge, and $0<1-x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can contain a compressive-strained Ge layer or a tensile-strained $Si_xGe_{1-x}$ (x>0.5) deposited on a relaxed $Si_{0.5}Ge_{0.5}$ buffer layer. In another example, the substrate 100 includes Si and a PMOS device region 100A contains $Si_xGe_{1-x}$.

The STI 101 is formed to electrically isolate the first device region 100A from the second device region 100B and the STI 101 horizontally defines boundaries of the device regions 100A and 100B. The STI 101 may be formed using conventional methods, for example by selectively etching an opening in the substrate 100 using a patterned mask or photoresist, depositing silicon oxide or silicon nitride to fill the opening, and then planarizing the oxide or nitride.

The film stack in FIG. 1A includes a dielectric film 102 on the substrate 100. The dielectric film 102 can contain a $SiO_2$ (or $SiO_x$) film, a SiN (or $SiN_y$) film, a SiON (or $SiO_xN_y$) film, or a high-k film, or a combination of two or more thereof. The high-k film can, for example, contain metal oxides and their silicates, including $Ta_2O_5$, $TiO_2$, $ZrO_2$, $Al_2O_3$, $Y_2O_3$, $HfSiO_x$, $HfO_2$, $ZrO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof. The dielectric film 102 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the dielectric film 102 can, for example, be at least 2 Angstrom, between about 2 Angstrom and about 100 Angstrom, between about 5 Angstrom and about 60 Angstrom, or between about 10 Angstrom and about 30 Angstrom.

FIG. 1A further shows a first metal-containing gate electrode film 104 formed on the dielectric film 102. According to some embodiments, the first metal-containing gate electrode film 104 can contain a metal nitride, a metal carbide, a metal carbon nitride, or a combination thereof. Examples include one or more of TiN, TiC, TiCN, TiAlN, TiSiN, TaN, TaC, TaCN, TaAlN, TaSiN, WN, WC, WCN, WAlN, and WSiN. The first metal-containing gate electrode film 104 may be deposited by ALD, PEALD, CVD, or PECVD. A thickness of the first metal-containing gate electrode film 104 can, for example, be between about 10 Angstrom and about 200 Angstrom, between about 50 Angstrom and about 200 Angstrom, or between about 10 Angstrom and about 100 Angstrom.

Figure 1B:
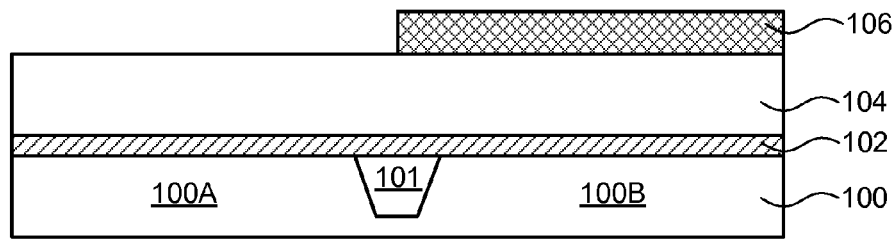

FIG. 1B schematically shows a patterned film 106 that may be selectively formed on the first metal-containing gate electrode film 104 by standard lithography and etching methods that can utilize a patterned mask. The pattern transfer to form the patterned film 106 may use one or more etching steps to remove the unprotected portion of the patterned film 106 above the first device region 100A. The one or more etching steps can, for example, include plasma etching, reactive ion etching (RIE), or wet etching using an etchant species in liquid solution. The patterned film 106 can contain photoresist. In some examples, the patterned film 106 can contain an organic mask or a hard mask (e.g., silicon nitride (SiN)).

Figure 1C:
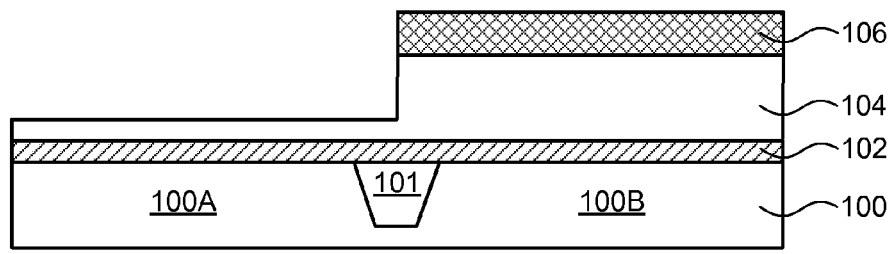

According to embodiments of the invention, an etching process may be performed on the structure shown in FIG. 1B to reduce the thickness of the first metal-containing gate electrode film 104 above the first device region 100A while the first metal-containing gate electrode film 104 above the second device region 100B is protected by the patterned film 106 and is not etched or thinned. The etching process may include a wet etching process or a dry etching process. FIG. 1C schematically shows the resulting films stack where a thickness of the first metal-containing gate electrode film 104 is less over the first device region 100A than over the second device region 100B. According to some embodiments, a thickness of the first metal-containing gate electrode film 104 over the first device region 100A (labeled as 105) can, for example, be between about 5 Angstrom and about 100 Angstrom, between about 30 Angstrom and about 50 Angstrom, between about 10 Angstrom and about 30 Angstrom, or between about 10 Angstrom and about 20 Angstrom. In some examples, a thickness of the first metal-containing gate electrode film 104 over the second device region 100B can be between about 10 Angstrom and about 100 Angstrom, between about 30 Angstrom and about 50 Angstrom, or between about 10 Angstrom and about 30 Angstrom. In one example, a thickness of the first metal-containing gate electrode film 104 over the first device region 100A is between about 10 Angstrom and about 30 Angstrom, and a thickness of the first metal-containing gate electrode film 104 over the second device region 100B is between about 50 Angstrom and about 150 Angstrom.

Figure 1D:
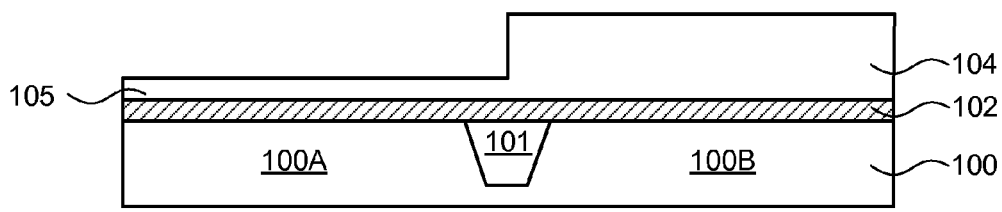

FIG. 1D shows the resulting film stack after removing the patterned film 106 from the film stack.

Figure 1E:
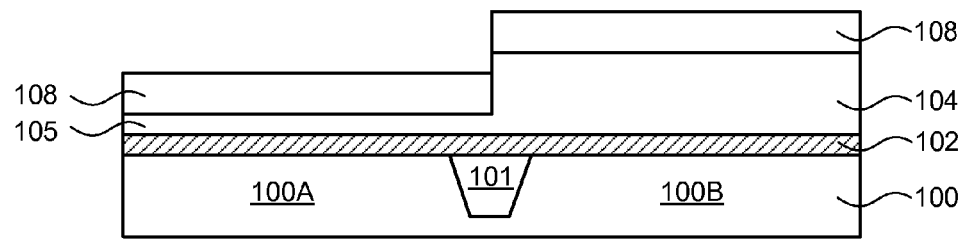

FIG. 1E shows a second metal-containing film 108 deposited on the first metal-containing gate electrode film 104 over the first and second device regions 100A/100B. According to one embodiment of the invention, the second metal-containing film 108 can contain or consist of a Ti metal film. According to another embodiment of the invention, the second metal-containing film 108 can contain or consist of an Al metal film. The second metal-containing film 108 may be deposited by ALD, PEALD, CVD, or PECVD. According to one embodiment of the invention, the second metal-containing film 108 contains or consists of Ti metal that is deposited by PEALD. The PEALD process may use a titanium halide precursor (e.g., $TiCl_4$), Ar, and $H_2$. The plasma may be generated using a capacitively coupled plasma (CCP) source. A thickness of the second metal-containing film 108 can, for example, be between about 10 Angstrom and about 200 Angstrom, between about 10 Angstrom and about 100 Angstrom, or between about 20 Angstrom and about 80 Angstrom.

Figure 1F:
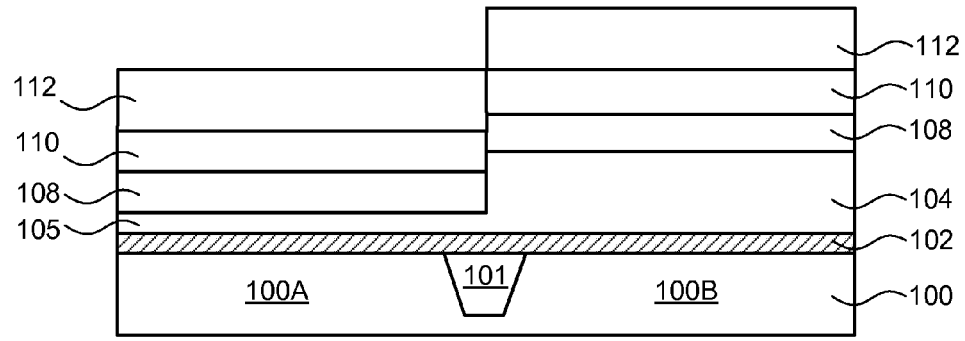

Thereafter, as depicted in FIG. 1F, a nitride cap layer 110 (e.g., TiN) may be deposited on the second metal-containing film 108, and a top metal layer 112 (e.g., Al or W) may be deposited on the nitride cap layer 110.

Figure 1G:
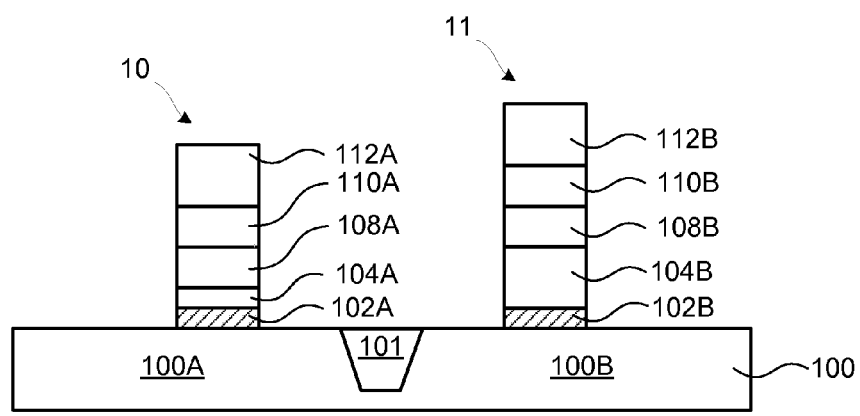

According to embodiments of the invention, the film stack depicted in FIG. 1F may be further processed to manufacture a dual workfunction semiconductor device on the substrate 100. FIG. 1G schematically shows a cross-sectional view a first gate stack 10 above the first device region 100A, where the first gate stack 10 contains a first gate dielectric 102A, a first metal-containing gate electrode 104A, a second metal-containing gate electrode 108A, a patterned nitride cap layer 110A, and a patterned top metal layer 112A. FIG. 1G further shows a cross-sectional view a second gate stack 11 above the second device region 100B, where the second gate stack 11 contains a first gate dielectric 102B, a first metal-containing gate electrode 104B, a second metal-containing gate electrode 108B, a patterned nitride cap layer 110B, an a patterned top metal layer 112B. As described above, a thickness of the first metal-containing gate electrode 104A is less than the thickness of the first metal-containing gate electrode 104B. The first gate stack 10 and the second gate stack 11 may be formed by standard lithography and etching methods that can utilize a patterned mask. The one or more etching steps can, for example, include plasma etching, reactive ion etching (RIE), or wet etching using an etchant species in liquid solution.

FIGS. 2A-2G schematically show cross-sectional views of a method of forming a dual workfunction semiconductor device according to another embodiment of the invention. The method shown in FIGS. 2A-2F is similar to the method shown in FIGS. 1A-1F, and for the sake of brevity, description of all the same or similar processing steps and materials will not be repeated.

Figure 2A:
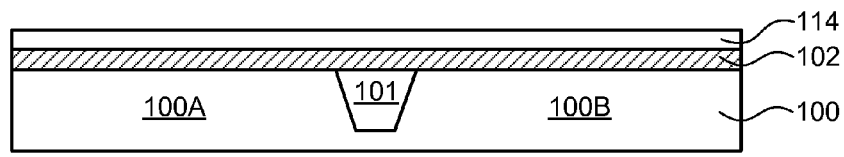
FIGS. 2A-2G schematically show cross-sectional views of a method of forming a dual workfunction semiconductor device according to another embodiment of the invention.

FIG. 2A schematically shows a cross-sectional view of a film stack on a substrate 100 having a first device region 100A and a second device region 100B that are separated by a shallow trench isolation (STI) 101. The film stack includes a dielectric film 102 on the substrate 100 and a first metal-containing gate electrode film 114 formed on the dielectric film 102. According to some embodiments, the first metal-containing gate electrode film 114 can contain a metal nitride, a metal carbide, a metal carbon nitride, or a combination thereof. Examples include one or more of TiN, TiC, TiCN, TiAlN, TiSiN, TaN, TaC, TaCN, TaAlN, TaSiN, WN, WC, WCN, WAlN, and WSiN. The first metal-containing gate electrode film 114 may be deposited by ALD, PEALD, CVD, or PECVD. A thickness of the first metal-containing gate electrode film 114 can, for example, be between about 10 Angstrom and about 200 Angstrom, between about 50 Angstrom and about 200 Angstrom, or between about 10 Angstrom and about 100 Angstrom.

Figure 2B:
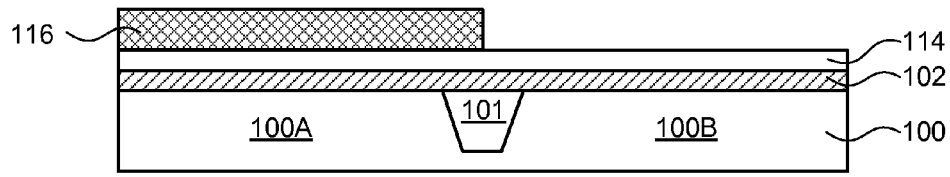

FIG. 2B schematically shows a first patterned film 116 that may be selectively formed on the first metal-containing gate electrode film 114 by standard lithography and etching methods that can utilize a patterned mask. The pattern transfer to form the first patterned film 116 may use one or more etching steps to remove the unprotected portion of the first patterned film 116 above the second device region 100B. The one or more etching steps can, for example, include plasma etching, reactive ion etching (RIE), or wet etching using an etchant species in liquid solution. The first patterned film 116 can contain photoresist. In some examples, the first patterned film 116 can contain an organic mask or a hard mask (e.g., silicon nitride (SiN)).

Figure 2C:
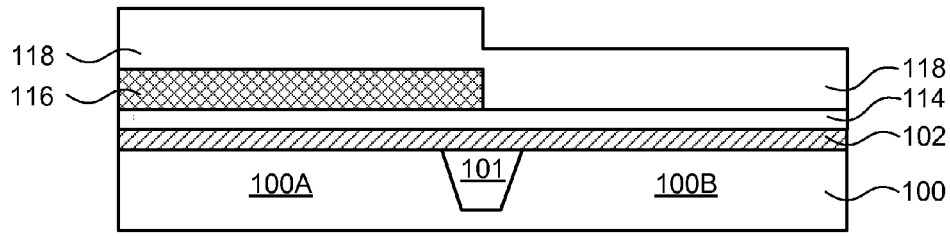

FIG. 2C shows additional first metal-containing gate electrode film 118 deposited on the first metal-containing gate electrode film 114 over the second device region 100B and on the first patterned film 116 over the first device region 100A. According to embodiments of the invention, the additional first metal-containing gate electrode film 118 is the same material as the first metal-containing gate electrode film 114.

Figure 2D:
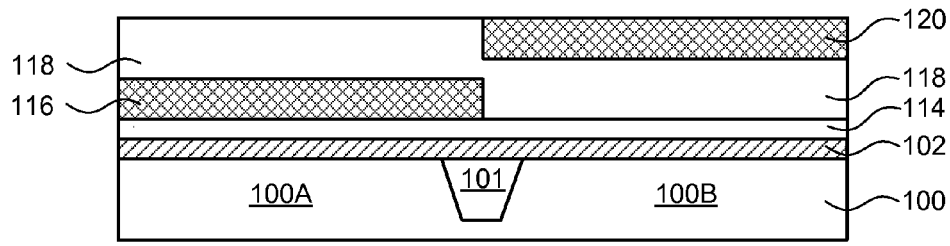

FIG. 2D schematically shows a second patterned film 120 that may be selectively formed on the additional first metal-containing gate electrode film 118 by standard lithography and etching methods that can utilize a patterned mask. The pattern transfer to form the second patterned film 120 may use one or more etching steps to remove the unprotected portion of the second patterned film 120 above the first device region 100A. The one or more etching steps can, for example, include plasma etching, reactive ion etching (RIE), or wet etching using an etchant species in liquid solution. The second patterned film 120 can contain photoresist. In some examples, the second patterned film 120 can contain an organic mask or a hard mask (e.g., silicon nitride (SiN)).

Figure 2E:
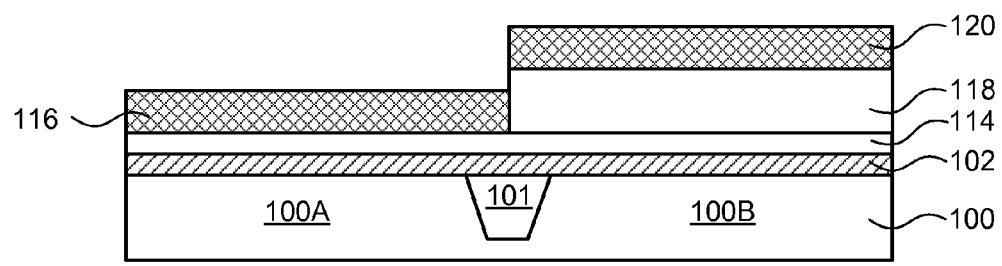

According to embodiments of the invention, an etching process may be performed on the structure shown in FIG. 2D to remove additional first metal-containing gate electrode film 118 above the first device region 100A while the additional first metal-containing gate electrode film 118 above the second device region 100B is protected by the second patterned film 120 and is not etched. The etching process may include a wet etching process or a dry etching process. FIG. 2E schematically shows the resulting films stack containing the additional first metal-containing gate electrode film 118 above the second device region 100B.

Figure 2F:
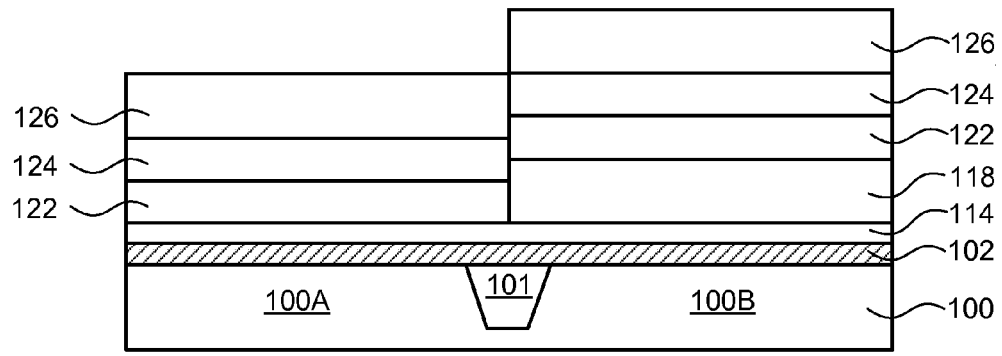

Thereafter, as depicted in FIG. 2F, after removing the first patterned film 116 and the second patterned film 120, a second metal-containing gate electrode film 122 is deposited on the first metal-containing gate electrode film 114 over the first device region 100A and on the additional first metal-containing gate electrode film 118 over the second device region 100B. According to embodiments of the invention, the second metal-containing gate electrode film 122 can contain or consist of the same material as the first metal-containing gate electrode film 114. In one example, the second metal-containing gate electrode film 122 can contain or consist of a Ti metal film. The second metal-containing film may be deposited by ALD, PEALD, CVD, or PECVD. According to one embodiment of the invention, the second metal-containing gate electrode film 122 contains or consists of Ti metal that is deposited by PEALD. The PEALD process may use a titanium halide precursor (e.g., $TiCl_4$), Ar, and $H_2$. The plasma may be generated using a capacitively coupled plasma (CCP) source. A thickness of the second metal-containing gate electrode film 122 can, for example, be between about 10 Angstrom and about 200 Angstrom, between about 10 Angstrom and about 100 Angstrom, or between about 20 Angstrom and about 80 Angstrom.

FIG. 2F further shows a nitride cap layer 124 (e.g., TiN) may be deposited on the second metal-containing gate electrode film 122, and a top metal layer 126 (e.g., Al) may be deposited on the nitride cap layer 124.

Figure 2G:
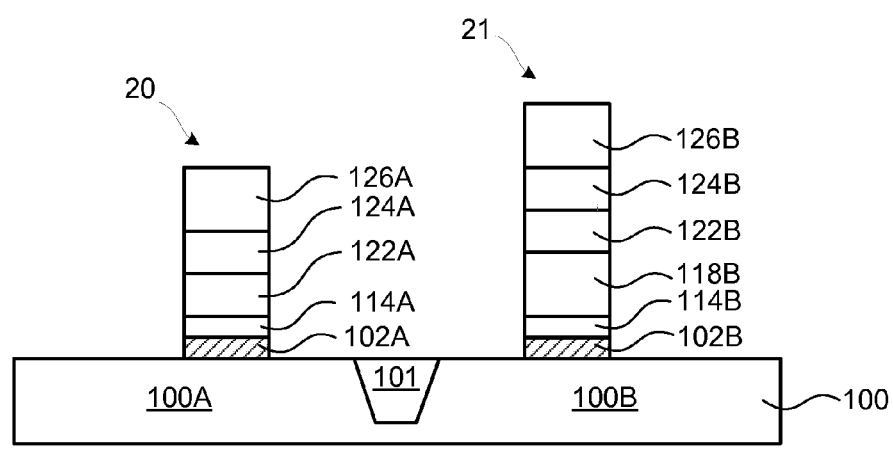

According to embodiments of the invention, the film stack depicted in FIG. 2F may be further processed to manufacture a dual workfunction semiconductor device on the substrate 100. FIG. 2G schematically shows a cross-sectional view a first gate stack 20 above the first device region 100A, where the first gate stack 20 contains a first gate dielectric 102A, a first metal-containing gate electrode 114A, a second metal-containing gate electrode 122A, a patterned nitride cap layer 124A, and a patterned top metal layer 126A. FIG. 2G further shows a cross-sectional view a second gate stack 21 above the second device region 100B, where the second gate stack 21 contains a first gate dielectric 102B, a first metal-containing gate electrode 114B, an additional first metal-containing gate electrode 118B, a second metal-containing gate electrode 122B, a patterned nitride cap layer 124B, an a patterned top metal layer 126B. The first gate stack 20 and the second gate stack 21 may be formed by standard lithography and etching methods that can utilize a patterned mask. The one or more etching steps can, for example, include plasma etching, reactive ion etching (RIE), or wet etching using an etchant species in liquid solution.

Figure 3A:
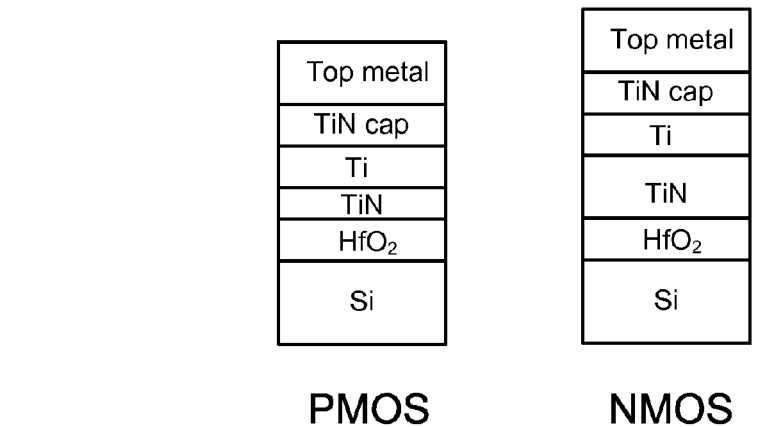
FIG. 3A schematically shows PMOS and NMOS gate structures of a dual workfunction semiconductor device according to an embodiment of the invention.

FIG. 3A schematically shows PMOS and NMOS gate structures of a dual workfunction semiconductor device according to an embodiment of the invention. The PMOS and NMOS gate structures contain a Si substrate, a 30 Angstrom thick $HfO_2$ gate dielectric on the Si substrate, a TiN first gate electrode on the $HfO_2$ gate dielectric, a 50 Angstrom thick Ti metal second gate electrode on the TiN first gate electrode, a TiN cap layer on the Ti metal second gate electrode, and an Al top metal layer on the TiN cap layer. The Ti metal was deposited by a PEALD process using a process gas containing $TiCl_4$, Ar, and $H_2$.

Figure 3B:
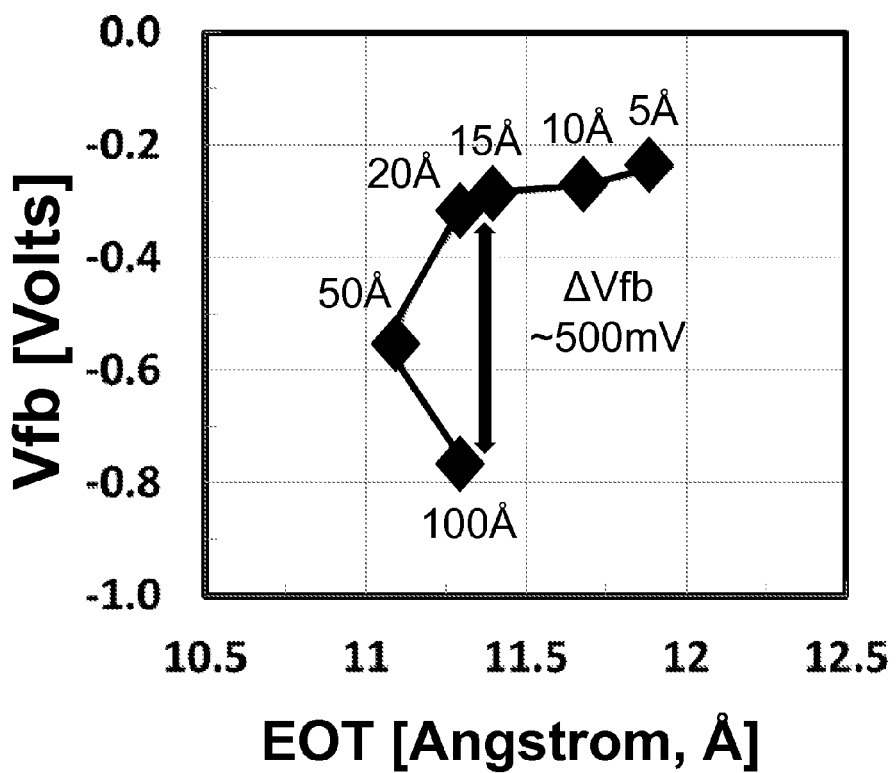
FIG. 3B is a graph showing the differences in workfunction of the PMOS and NMOS gate structures of FIG. 3A according to an embodiment of the invention.

FIG. 3B is a graph showing the measured differences in the workfunction of the PMOS and NMOS gate structures of FIG. 3A. The differences in the workfunction are plotted as the flat band voltage ($V_{fb}$) versus the equivalent oxide thickness (EOT) for different thicknesses of the TiN first gate electrode in the PMOS gate structure. The thickness of the TiN first gate electrode in the NMOS gate structure was 100 Angstrom and the thickness of the TiN first gate electrode in the PMOS gate structure was varied from 5 Angstrom to 100 Angstrom. FIG. 3B shows that the differences in $V_{fb}$ ($\Delta V_{fb}$) between the PMOS and NMOS gate structures varied up to about 500 mV. This allows the use of the inventive PMOS and NMOS gate structures in a dual workfunction semiconductor device. The unexpected large $\Delta V_{fb}$ values are thought to be due to chemical modification of the TiN first gate electrode during the plasma deposition of the Ti metal second gate electrode on the TiN first gate electrode. The chemical modification can include chemical reduction and/or nitrogen removal from the TiN material which in turn can create oxygen vacancies in the underlying $HfO_2$ material by oxygen diffusion from the $HfO_2$ material into the chemically modified TiN material. As shown in FIG. 3B, the ability of the TiN first gate electrode to remove oxygen from the $HfO_2$ material increases as the thickness of the TiN first gate electrode is increased from 5 Angstrom to 100 Angstrom.

A plurality of embodiments for a method of forming a dual workfunction semiconductor device have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting.

It should be understood that various modifications and variations of the present invention may be employed in practicing the invention. It is therefore to be understood that, within the scope of the appended claims, the invention may be practiced otherwise than as specifically described herein.

What is claimed is:

1. A method for forming a dual workfunction semiconductor device, comprising:
    providing a substrate containing first and second device regions; depositing a dielectric film on the substrate;
    forming a first metal-containing gate electrode film on the dielectric film, wherein a thickness of the first metal-containing gate electrode film is less over the first device region than over the second device region;
    depositing a second metal-containing gate electrode film on the first metal-containing gate electrode film;
    patterning the second metal-containing gate electrode film, the first metal- containing gate electrode film, and the dielectric film to form a first gate stack above the first device region and a second gate stack above the second device region, and
    wherein forming the first metal-containing gate electrode film comprises:
    depositing the first metal-containing gate electrode film on the dielectric film;
    forming a first patterned film on the first metal-containing gate electrode film above the first device region;
    depositing additional first metal-containing gate electrode film on the first patterned film and on the first metal-containing gate electrode film;
    forming a second patterned film on the additional first metal-containing gate electrode film above the second device region;
    removing the additional first metal-containing gate electrode film above the first device region to expose the first patterned film, and
    removing the first and second patterned films, wherein the patterning further comprises patterning the additional first metal containing gate electrode film above the second device region.

2. The method of claim 1, wherein the additional first metal-containing gate electrode film is the same material as the first metal-containing gate electrode film.

3. The method of claim 1, wherein the second gate stack has a lower workfunction than the first gate stack.

4. The method of claim 1, wherein the dielectric film contains a $SiO_2$ layer, a SiN layer, a SiON layer, a high-k film, or a combination of two or more thereof.

5. The method of claim 4, wherein the high-k film contains $Ta_2O_5$, $TiO_2$, $ZrO_2$, $Al_2O_3$, $Y_2O_3$, $HfSiO_x$, $HfO_2$, $ZrO_2$, $ZrSiO_x$, $TaSiO_x$, $SrO_x$, $SrSiO_x$, $LaO_x$, $LaSiO_x$, $YO_x$, or $YSiO_x$, or a combination of two or more thereof.

6. The method of claim 1, wherein the first metal-containing gate electrode film contains TiN, TiC, TiCN, TiAlN, TiSiN, TaN, TaC, TaCN, TaAlN, TaSiN, WN, WC, WCN, WAlN, WSiN, or combination of two or more thereof.

7. The method of claim 1, wherein the second metal-containing gate electrode film contains a Ti metal film or an Al metal film.

8. The method of claim 1, wherein the first metal-containing gate electrode film contains a TiN film and the second metal-containing gate electrode film contains a Ti metal film.

* * * * *